United States Patent [19]
Wittman

[11] Patent Number: 5,850,156
[45] Date of Patent: Dec. 15, 1998

[54] PROCESSOR SUPERVISORY CIRCUIT AND METHOD HAVING INCREASED RANGE OF POWER-ON RESET SIGNAL STABILITY

[75] Inventor: Brian Albert Wittman, Indianapolis, Ind.

[73] Assignee: Lucent Technologies Inc., Murray Hill, N.J.

[21] Appl. No.: 597,754

[22] Filed: Feb. 7, 1996

[51] Int. Cl.[6] ...................................................... H03L 7/00
[52] U.S. Cl. .............................. 327/143; 327/68; 327/72; 327/143; 327/198
[58] Field of Search ................................. 327/54, 68, 72, 327/198, 143, 560, 563

[56] References Cited

U.S. PATENT DOCUMENTS

| | | | |
|---|---|---|---|
| 4,245,150 | 1/1981 | Driscoll et al. | 235/92 FP |
| 5,214,316 | 5/1993 | Nagai | 327/143 |
| 5,287,011 | 2/1994 | Koshikawa et al. | 327/143 |
| 5,485,111 | 1/1996 | Tanimoto | 327/198 |
| 5,581,206 | 12/1996 | Chevalier et al. | 327/143 |

*Primary Examiner*—Timothy P. Callahan
*Assistant Examiner*—Jung Ho Kim

[57] ABSTRACT

For use in a processor supervisory circuit, a power-on reset circuit, a method of producing a power-on reset ("RESET") signal and a power supply including the circuit. The circuit includes: (1) an adaptive, nonlinear voltage divider having a voltage input and a voltage output, the divider dividing an unscaled, unregulated voltage received at the voltage input by a factor that varies a function of the unscaled, unregulated voltage to produce a scaled, unregulated voltage at the voltage output and (2) a comparison circuit for comparing the scaled, unregulated voltage with a scaled, regulated voltage to produce the RESET signal when the scaled, regulated voltage exceeds the scaled, unregulated voltage, the divider being adaptive and nonlinear to ensure that the comparison circuit continuously produces the RESET signal when the scaled, regulated voltage exceeds the scaled, unregulated voltage and thereby avoid premature activation of a processor couplable to the power-on reset circuit.

17 Claims, 3 Drawing Sheets ns5,850,156

PROCESSOR SUPERVISORY CIRCUIT AND METHOD HAVING INCREASED RANGE OF POWER-ON RESET SIGNAL STABILITY

TECHNICAL FIELD OF THE INVENTION

The present invention is directed, in general, to processor supervisory circuits and, more specifically, to a low-cost, discrete-component processor supervisory circuit having an increased range of power-on reset signal stability.

BACKGROUND OF THE INVENTION

Those of skill in the art readily understand the importance of starting a processor-based system in a known state to assure system stability. When the processor is in an unknown state, it should be held in reset until stability is assured.

Processor supervisory circuits are commonly employed to assure that a processor-based system starts in a known state. The generic function of such supervisory circuits is to assert a reset signal and thereby hold the processor in the reset state while power is applied to the processor. The circuitry providing this function is commonly known as "power-on reset" circuitry. The power-on reset circuitry is needed because instabilities in power supply voltages are typically encountered during the brief period of time following the application of power to the processor. Once the processor supervisory circuit determines that a stable DC voltage supply is available, it provides a signal to the processor (and, perhaps, other subsystems) that normal operations may commence.

A processor supervisory circuit may also provide circuitry that can sense imminent power failure. Such circuitry is commonly known to those of skill in the art as "power-fail sense" circuitry. Power-fail sense circuitry can be used to advantage in a processor-based system to provide an early warning of loss of power. The power-fail sense circuitry typically monitors an unregulated DC input voltage, providing a power-fail sense control signal for the benefit of processor-based system circuits when it appears that a regulated DC voltage, derived from the unregulated DC input voltage, may lose regulation. Circuits providing regulated DC voltage lose regulation, i.e., become unstable, when the unregulated DC input voltage drops below a predetermined threshold. The power-fail sense control signal can thus be used to interrupt ordinary processor operations, allowing the processor to prepare for an orderly power-down.

One prior art circuit suitable to provide the functions of power-on reset and power-fail sense, as described generally supra, is the MAX708 integrated microprocessor supervisory circuit commercially available from Maxim Integrated Products. The MAX708 integrated microprocessor supervisory circuit provides a reset output during power-up, power-down and brownout conditions, and a low voltage threshold detector for power-fail warning. A significant disadvantage of prior art processor supervisory circuits, such as the MAX708, is that they suffer from uncontrolled signal outputs at low input voltages. For example, it in a nominal 5 volt computer system, the regulated DC input voltage rises during power-up to 2 or 3 volts, the prior art processor supervisory circuits may spuriously deassert the reset output signal temporarily, activating the processor prematurely. If the processor is prematurely activated, it is liable to attempt accesses to memory coupled to the processor. If the memory is writable, the attempted access may corrupt the memory's contents, probably damaging any data or programs stored therein. This corruption is highly undesirable and should be avoided.

Accordingly, what is needed in the art is a processor supervisory circuit and method having increased range of power-on reset signal stability to prevent premature activation of the processor. More specifically, what is needed is a processor supervisory circuit that remains stable at low input voltages.

SUMMARY OF THE INVENTION

To address the above-discussed deficiencies of the prior art, the present invention provides a novel, low-cost, discrete-component processor supervisory circuit. More specifically, the present invention provides, for use in a processor supervisory circuit, a power-on reset circuit, a method of producing a power-on reset ("RESET") signal and a power supply including the circuit.

The circuit includes: (1) an adaptive, nonlinear voltage divider having a voltage input and a voltage output, the divider dividing an unscaled, unregulated voltage received at the voltage input by a factor that varies as a function of the unscaled, unregulated voltage to produce a scaled, unregulated voltage at the voltage output and (2) a comparison circuit for comparing the scaled, unregulated voltage with a scaled, regulated voltage to produce the RESET signal when the scaled, regulated voltage exceeds the scaled, unregulated voltage, the divider being adaptive and nonlinear to ensure that the comparison circuit continuously produces the RESET signal when the scaled, regulated voltage exceeds the scaled, unregulated voltage and thereby avoid premature activation of a processor couplable to the power-on reset circuit.

The present invention introduces a processor supervisory circuit that avoids instabilities at low voltages by providing a nonlinear voltage divider to scale input voltages by a factor that varies as a function of the values of the voltages. This ensures that, at low input voltages, conditions that could cause deassertion of the reset signal cannot exist.

In one embodiment of the present invention, the divider comprises a switch, activatable as a function of the unscaled, unregulated voltage, to introduce an additional resistive element into the divider to change the factor. Of course, resistances or, more broadly, impedances, may be introduced into or removed from the divider to change the factor by which it divides the unscaled, unregulated voltage. Further, those of ordinary skill in the art are familiar with other ways of scaling voltages using pulse-width modulation or the like. All such adaptive dividers are within the scope of the present invention.

In one embodiment of the present invention, the comparison circuit employs positive feedback to obtain transfer characteristics with hysteresis. The addition of hysteresis, that may be provided by a resistor, means that instead of having one threshold the comparator will have two thresholds, one on either side of a reference voltage, whereby undesired toggling of the comparison circuit discrete output states is avoided.

In one embodiment of the present invention, the processor supervisory circuit further comprises a power-fail sense circuit for producing a power-fail sense ("PFS") signal. Although not necessary to the present invention, the PFS signal serves as a warning to the processor that the power supply is unstable, affording the processor time to take precautionary action.

In one embodiment of the present invention, the power-on reset circuit further comprises a switching circuit for receiving a signal from the comparison circuit to produce the RESET signal. Although not necessary to the present invention, the switching circuit preferably produces a RESET signal of proper voltage (nominally 5 volts for most computer systems).

In one embodiment of the present invention, a nonadaptive, linear voltage divider produces the scaled, regulated voltage. Of course, circuits other than dividers may be employed to produce the scaled, regulated voltage.

Another embodiment of the present invention provides a power supply, comprising: (1) AC-to-DC voltage conversion circuitry, (2) a storage capacitor, coupled to an output of the conversion circuitry, for receiving and storing unregulated electrical power received from the conversion circuitry, (3) a voltage regulator, coupled to the storage capacitor, for regulating the unregulated electrical power received from the storage capacitor and (4) a processor supervisory circuit.

The processor supervisory circuit comprises: (4a) a power-on reset circuit, comprising: (4ai) an adaptive, nonlinear voltage divider having a voltage input and a voltage output, the divider dividing an unscaled, unregulated voltage received at the voltage input by a factor that varies a function of the unscaled, unregulated voltage to produce a scaled, unregulated voltage at the voltage output and (4aii) a comparison circuit for comparing the scaled, unregulated voltage with a scaled, regulated voltage to produce RESET signal when the scaled, regulated voltage exceeds the scaled, unregulated voltage, the divider being adaptive and nonlinear to ensure that the comparison circuit continuously produces the RESET signal when the scaled, regulated voltage exceeds the scaled, unregulated voltage and thereby avoid premature activation of a processor couplable to the power-on reset circuit and (4b) a power-fail sense circuit for producing a PFS signal. Those of ordinary skill in the art will recognize, however, that the present invention can find beneficial application in other than power supplies.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
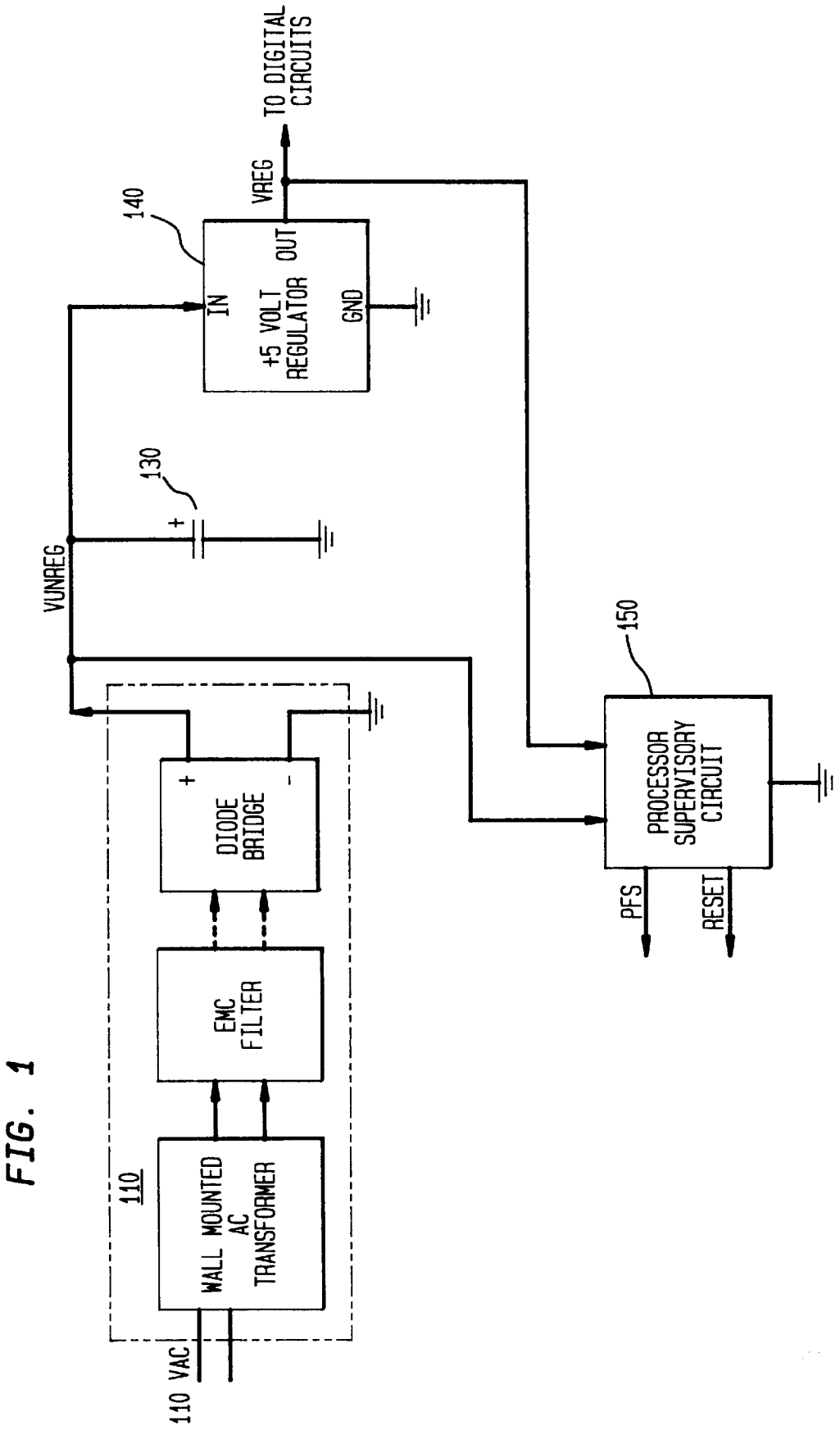
FIG. 1 illustrates a block diagram of a power supply employing the processor supervisory circuit of the present invention.

Referring initially to FIG. 1, illustrated is a block diagram of a power supply employing the processor supervisory circuit of the present invention. The power supply 100 is comprised of AC-to-DC voltage conversion circuitry 110, storage capacitor 130, +5 volt voltage regulator 140, and processor supervisory circuit 150.

AC-to-DC voltage conversion circuitry 110, comprised of an AC step-down voltage transformer 111, EMC filter 112, and diode bridge 113, is a generic design, the operation of which is well-known to those of ordinary skill in the art and thus will not be discussed herein. The output of AC-to-DC voltage conversion circuitry 110 is comprised of unregulated DC voltage VUNREG, having a nominal peak value between 8 and 14 volts DC.

VUNREG charges storage capacitor 130 such that it can provide short-duration reserve power capacity during AC brown-out conditions. VUNREG is also provided as an input to +5 volt voltage regulator 140 that produces +5 volt regulated voltage VREG to be used by digital circuits contained within a computer-controlled device, such as a telephone. The +5 volt regulated output VREG of voltage regulator 140 is also provided as an input to processor supervisory circuit 150.

Processor supervisory circuit 150 further receives as an input the unregulated DC voltage VUNREG produced by AC-to-DC voltage conversion circuitry 110. In a manner to be more fully discussed infra, processor supervisory circuit 150 compares VUNREG with the +5 volt regulated output VREG of voltage regulator 140 and generates two logic signals; power fail sense ("PFS") and reset ("RESET"). As described herein, signals PFS and RESET are active-low signals; however, those of skill in the art will recognize that PFS and RESET may suitably be active-high signals in particular embodiments. In a computer system employing a preferred embodiment of the present invention, control signals PFS and RESET may be employed to advantage to indicate various stages of impending power failure to select computer subsystems.

Figure 2:
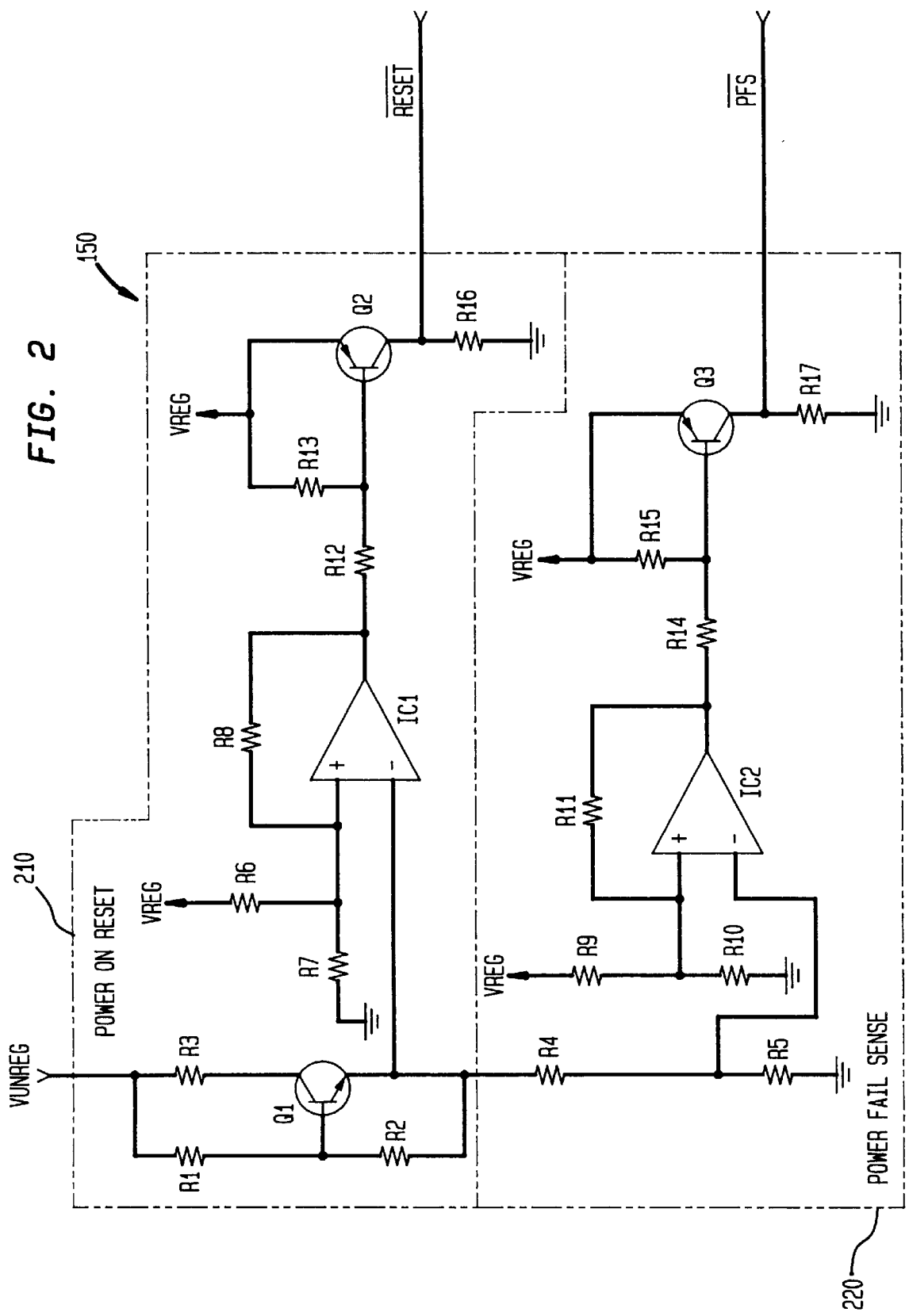
FIG. 2 illustrates a component-level schematic diagram of a preferred embodiment of the processor supervisory circuit of FIG. 1.

Turning now to FIG. 2, illustrated is a component-level schematic diagram of a preferred embodiment of the processor supervisory circuit 150 of FIG. 1. Processor supervisory circuit 150 is comprised of power-on reset circuitry 210 and power-fail sense circuitry 220. Those of ordinary skill in the art will recognize from the description of operation that follows that power-fail sense circuitry 220 operates analogously to the operation of power-on reset circuitry 210. Therefore, only a detailed description of operation of power-on reset circuitry 210 will be provided herein. At the core of processor supervisory circuit 150 is a comparator circuit employing hysteresis comprised of operational amplifier IC1 and resistor R8. The topology of comparator circuits employing hysteresis are known to the art and will not be discussed in detail herein. Proper selection of a value for resistor R8 ensures that the circuit functions as a comparator with hysteresis and that its transfer characteristics minimizes the possibility of output voltage toggling.

The comparator circuit compares a modified version of VUNREG to a reference voltage derived from VREG by a voltage divider circuit comprised of resistors R6 and R7. As described supra, VREG is the output of +5 volt voltage regulator 140, and the input to voltage regulator 140 is VUNREG. Common voltage regulators are characterized by an input voltage threshold below which the regulator is incapable of maintaining a regulated output. Therefore, by comparing VUNREG with a properly selected reference voltage, it is possible for the comparator circuit to indicate when VUNREG is approaching the voltage threshold below which voltage regulator 140 is unable to maintain the regulated +5 volt output VREG.

The comparison circuit employs positive feedback, provided by resistor R8, to obtain transfer characteristics with hysteresis. The addition of hysteresis means that instead of having one threshold the comparator will have two thresholds, a low threshold $V_{TL}$ and a high threshold $V_{TH}$, one on either side of the desired reference voltage, whereby undesired toggling of the comparison circuit discrete output states is avoided. The output of the comparator circuit has a value corresponding to one of two possible states, characterized herein as "high" or "low," which depend on the value of VUNREG and whether VUNREG is increasing or decreasing in magnitude. For example, if VUNREG is increasing in magnitude, the comparator circuit output will remain in the low state until the input level exceeds the high threshold $V_{TH}$. Subsequently the comparator circuit output will remain in the high state even if the signal decreases below $V_{TH}$. The comparator circuit output will switch to the low state only if the input signal is decreased below the low threshold $V_{TL}$.

The "high" or "low" output of the comparator circuit is applied to a switching circuit comprised of resistors R12, R13, R16, and transistor Q2. When the comparator circuit output is "low," corresponding to VUNREG above the voltage threshold, transistor Q2 turns on. When Q2 is on, the RESET (low) output is pulled up to approximately VREG through transistor Q2, and thus is at a voltage of approximately +5 volts, corresponding to a deassertion of the RESET (low) signal. Conversely, when the comparator circuit output is "high," corresponding to VUNREG below the voltage threshold, transistor Q2 turns off. When Q2 is off, the RESET (low) output is tied to ground by resistor R16, and thus is at a voltage of 0 volts, corresponding to an assertion of the RESET (low) signal.

A novel feature of the processor supervisory circuit 150 of the present invention is the use of an adaptive nonlinear voltage divider circuit which improves the ability to control the state of circuit outputs RESET and PFS down to 0 volts input. The adaptive non-linear voltage divider circuit is comprised of resistors R1, R2, R3, R4, R5 and transistor Q1, and is used to scale VUNREG by a factor K1. The circuit operates such that the scale factor K1 is itself a function of VUNREG. For low values of VUNREG, transistor Q1 is cut off, resistor R3 is effectively removed from the circuit, and the voltage at the inverting input of operational amplifier IC1 is equal to VUNREG K1, where K1 is approximately equal to (R4+R5)/(R1+R2+R4+R5). For high values of VUNREG transistor Q1 is saturated and K1 is approximately equal to (R4+R5)/(R3+R4+R5), assuming that R1 is significantly larger than R3 and can therefore be ignored. At intermediate values of VUNREG, a transition region occurs when transistor Q1 is operating in its linear region and K1 varies continuously with increasing VUNREG. The resulting voltage, VUNREG K1, is shown as voltage plot 330 in FIG. 3.

Figure 3:
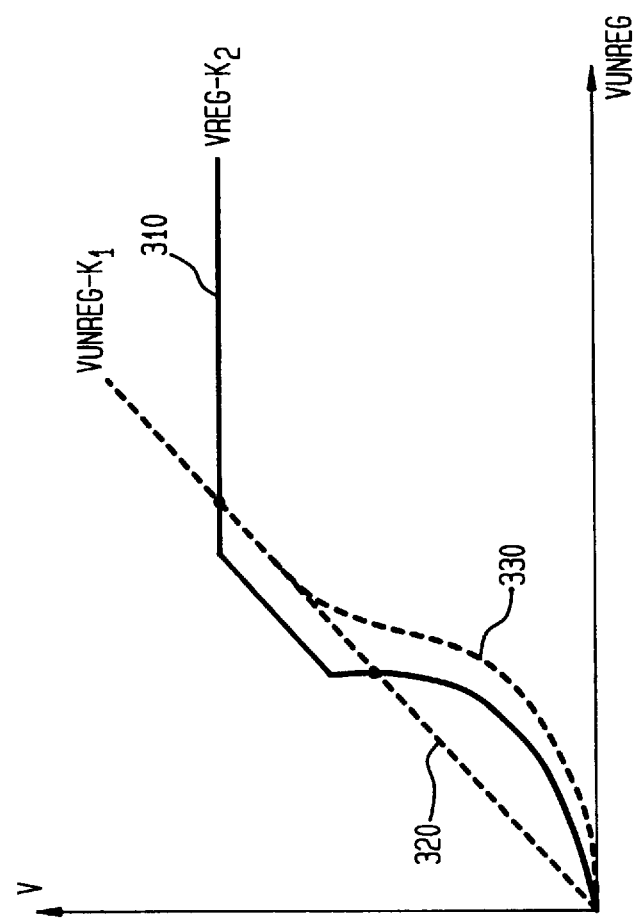
FIG. 3 illustrates characteristic voltage waveforms employed in the processor supervisory circuit of FIG. 2.

Turning now to FIG. 3, illustrated are characteristic voltage waveforms employed in the processor supervisory circuit 150 of FIG. 2. Voltage plot 310 in FIG. 3 represents the voltage input applied to the non-inverting input of operational amplifier IC1. This voltage is equal to VREG K2, where K2 is the voltage divider ratio developed by resistors R6 and R7. Whereas K2 is constant, the voltage plot illustrated represents the output voltage response of +5 volt voltage regulator 140 for varying input voltages VUNREG. This output voltage response is a characteristic of most commonly-available voltage regulators.

As illustrated in FIG. 3, voltage plot 320 intersects voltage plot 310 in two places. Voltage plot 320 is representative of the voltage that would appear at the inverting input of IC1 if a single resistor was substituted for the adaptive non-linear voltage divider circuit comprised of resistors R1, R2, R3, R4, R5 and transistor Q1. Unchecked, the double intersection would cause the comparator circuit employed in power-on reset circuit 210 to change states twice before voltage regulator 140 goes into regulation and would thus cause the RESET output to be deasserted at low voltages, potentially causing improper operation of the circuit receiving power from power supply 100. To correct this serious potential problem, the present invention uses the novel adaptive non-linear voltage divider circuit as hereinabove described.

Using appropriately-selected component values for the novel adaptive non-linear voltage divider circuit of the present invention results in the voltage at the inverting input of operational amplifier IC1 to be as shown by voltage plot 330 in FIG. 3. As can be seen, voltage plot 330, which resembles voltage plot 320 except at lower voltages, overcomes the problem of VUNREG K1 intersecting VREG K2 at low values of VUNREG, thereby controlling the output signals RESET and PFS down to 0 volts. The non-linear characteristic of the voltage divider can be adapted to the output voltage response characteristics of different voltage regulators 140 by varying the values of resistors R1, R2, and R3.

Another possible source of instability preventing the control of the output signals RESET and PFS down to 0 volts is the possibility that the output of operational amplifier IC1 may be unstable at low voltages. The operation of typical operational amplifiers cannot be assured when supply voltages necessary to power the amplifier are below specification. Therefore, resistors R12, R13 are appropriately selected to assure that transistor Q2 remains off, thus asserting RESET, whenever VREG is less than approximately 3 volts, regardless of the state of the operational amplifier IC1 output.

Although the present invention has been described in detail, those of ordinary skill in the art should understand that they can make various changes, substitutions and alterations herein without departing from the spirit and scope of the invention in its broadest form.

What is claimed is:

1. For use in a processor supervisory circuit, a power-on reset circuit, comprising:

an adaptive, nonlinear voltage divider having a voltage input and a voltage output, said divider dividing an unscaled, unregulated voltage received at said voltage input by a factor that varies as a function of said unscaled, unregulated voltage to produce a scaled, unregulated voltage at said voltage output; and a comparison circuit for comparing said scaled, unregulated voltage with a scaled, regulated voltage to produce a power-on reset (RESET) signal when said scaled, regulated voltage exceeds said scaled, unregulated voltage, said divider being adaptive and nonlinear to ensure that said comparison circuit continuously produces said RESET signal when said scaled, regulated voltage exceeds said scaled, unregulated voltage and thereby avoid premature activation of a processor couplable to said power-on reset circuit, said comparison circuit employing positive feedback to obtain transfer characteristics with hysteresis.

2. The power-on reset circuit as recited in claim 1 wherein said divider comprises a switch, activatable as a function of said unscaled, unregulated voltage, to introduce an additional resistive element into said divider to change said factor.

3. The power-on reset circuit as recited in claim 1 wherein said RESET signal is an active-high signal.

4. The power-on reset circuit as recited in claim 1 wherein said processor supervisory circuit further comprises a power-fail sense circuit for producing a power-fail sense (PFS) signal.

5. The power-on reset circuit as recited in claim 4 wherein said power-fail sense (PFS) signal is an active-high signal.

6. The power-on reset circuit as recited in claim 1 further comprising a switching circuit for receiving a signal from said comparison circuit to produce said RESET signal.

7. The power-on reset circuit as recited in claim 1 wherein a nonadaptive, linear voltage divider produces said scaled, regulated voltage.

8. For use in a processor supervisory circuit, a method of providing a power-on reset (RESET) signal, comprising the steps of:

dividing an unscaled, unregulated voltage received at a voltage input of an adaptive, nonlinear voltage divider by a factor that varies as a function of said unscaled, unregulated voltage to produce a scaled, unregulated voltage at a voltage output of said divider, and comparing said scaled, unregulated voltage with a scaled, regulated voltage to produce said RESET signal when said scaled, regulated voltage exceeds said scaled, unregulated voltage, said divider being adaptive and nonlinear to ensure that said RESET signal is continuously produced when said scaled, regulated voltage exceeds said scaled, unregulated voltage and thereby avoid premature activation of a processor receiving said RESET signal, said comparing comprises employing positive feedback to obtain transfer characteristics with hysteresis.

9. The method as recited in claim 8 wherein said divider comprises a switch activatable as a function of said unscaled, unregulated voltage, said step of dividing comprising the step of toggling said switch to introduce an additional resistive element into said divider to change said factor.

10. The method as recited in claim 8 wherein said processor supervisory circuit further comprises a power-fail sense circuit, said method further comprising the step of producing a power-fail sense signal, said RESET signal and said power-fail sense signal employable to indicate various stages of impending power failure.

11. The method as recited in claim 8 further comprising the step of receiving a signal from said comparison circuit into a switching circuit to produce said RESET signal.

12. The method as recited in claim 8 further comprising the step of producing said scaled, regulated voltage with a nonadaptive, linear voltage divider.

13. A power supply, comprising:

AC-to-DC voltage conversion circuitry;

a storage capacitor, coupled to an output of said conversion circuitry, for receiving and storing unregulated electrical power received from said conversion circuitry;

a voltage regulator, coupled to said storage capacitor, for regulating said unregulated electrical power received from said storage capacitor; and a processor supervisory circuit, coupled to said voltage regulator, comprising:

a power-on reset circuit, comprising:

an adaptive, nonlinear voltage divider having a voltage input and a voltage output, said divider dividing an unscaled, unregulated voltage received at said voltage input by a factor that varies as a function of said unscaled, unregulated voltage to produce a scaled, unregulated voltage at said voltage output, and a comparison circuit for comparing said scaled, unregulated voltage with a scaled, regulated voltage to produce a power-on reset (RESET) signal when said scaled, regulated voltage exceeds said scaled, unregulated voltage, said divider being adaptive and nonlinear to ensure that said comparison circuit continuously produces said RESET signal when said scaled, regulated voltage exceeds said scaled, unregulated voltage and thereby avoid premature activation of a processor couplable to said power-on reset circuit, said comparison circuit employing positive feedback to obtain transfer characteristics with hysteresis, and a power-fail sense circuit, coupled to said voltage regulator, for producing a power-fail sense (PFS) signal.

14. The power supply as recited in claim 13 wherein said divider comprises a switch, activatable as a function of said unscaled, unregulated voltage, to introduce an additional resistive element into said divider to change said factor.

15. The power supply as recited in claim 13 wherein said power-fail sense (PFS) signal is an active-high signal.

16. The power supply as recited in claim 13 further comprising a switching circuit for receiving a signal from said comparison circuit to produce said RESET signal.

17. The power supply as recited in claim 13 wherein a nonadaptive, linear voltage divider produces said scaled, regulated voltage.

* * * * *